United States Patent
Carioni et al.

(10) Patent No.: US 11,150,657 B2
(45) Date of Patent: Oct. 19, 2021

(54) LOSSY DATA COMPRESSOR FOR VEHICLE CONTROL SYSTEMS

(71) Applicant: Robert Bosch GmbH, Stuttgart (DE)

(72) Inventors: Marcello Carioni, Graz (AT); Giorgio Patrini, Amsterdam (NL); Max Welling, Bussum (NL); Patrick Forré, Amsterdam (NL); Tim Genewein, London (GB)

(73) Assignee: Robert Bosch GmbH, Stuttgart (DE)

( * ) Notice: Subject to any disclaimer, the term of this patent is extended or adjusted under 35 U.S.C. 154(b) by 284 days.

(21) Appl. No.: 16/420,440

(22) Filed: May 23, 2019

(65) Prior Publication Data
US 2019/0369619 A1 Dec. 5, 2019

(30) Foreign Application Priority Data
May 30, 2018 (EP) .................................... 18175062

(51) Int. Cl.
*G05D 1/00* (2006.01)
*G06N 20/00* (2019.01)
(Continued)

(52) U.S. Cl.
CPC ........... *G05D 1/0088* (2013.01); *B60W 10/04* (2013.01); *B60W 10/18* (2013.01); *B60W 10/20* (2013.01);
(Continued)

(58) Field of Classification Search
CPC .... G05D 1/0088; G05D 1/0061; G06N 20/00; B60W 10/04; B60W 10/18; B60W 10/20;
(Continued)

(56) References Cited

U.S. PATENT DOCUMENTS 7,724,961 B2  5/2010  Porikli et al.
7,907,784 B2 * 3/2011  Gladkova ................ G06T 9/00
                                                                   382/232
(Continued)

FOREIGN PATENT DOCUMENTS

EP          1752362 A1    2/2007

OTHER PUBLICATIONS

Canas, et al.: "Learning Probability Measures with Respect to Optimal Transport Metrics", MIT (2012), pp. 1-9.

*Primary Examiner* — Marthe Y Marc-Coleman
(74) *Attorney, Agent, or Firm* — Norton Rose Fulbright US LLP; Gerard Messina (57) ABSTRACT

A lossy data compressor for physical measurement data, comprising a parametrized mapping network hat, when applied to a measurement data point x in a space X, produces a point z in a lower-dimensional manifold Z, and configured to provide a point z on manifold Z as output in response to receiving a data point x as input, wherein the manifold Z is a continuous hypersurface that only admits fully continuous paths between any two points on the hypersurface; and the parameters θ of the mapping network are trainable or trained towards an objective that comprises minimizing, on the manifold Z, a distance between a given prior distribution $P_Z$ and a distribution $P_Q$ induced on manifold Z by mapping a given set $P_D$ of physical measurement data from X onto Z using the mapping network, according to a given distance measure.

15 Claims, 5 Drawing Sheets

(51) Int. Cl.
*B60W 10/04* (2006.01)
*B60W 10/18* (2012.01)
*B60W 10/20* (2006.01)
*B60W 50/00* (2006.01)
*B60W 50/14* (2020.01)

(52) U.S. Cl.
CPC ........ *B60W 50/0098* (2013.01); *B60W 50/14* (2013.01); *G05D 1/0061* (2013.01); *G06N 20/00* (2019.01); *B60W 2050/143* (2013.01)

(58) Field of Classification Search
CPC ............. B60W 50/0098; B60W 50/14; B60W 2050/143; G08G 1/165; G08G 1/166; G06K 9/6252; G06K 9/6232; G06F 17/11; H04N 19/182; H04N 19/186
See application file for complete search history.

(56) References Cited

U.S. PATENT DOCUMENTS

| | | |
|---|---|---|
| 8,682,821 B2 | 3/2014 | Benitez et al. |
| 9,014,876 B2 * | 4/2015 | Mason .................... G07C 5/008 701/2 |
| 10,650,621 B1 * | 5/2020 | King ....................... H04L 67/10 |
| 2009/0018801 A1 * | 1/2009 | Gladkova ............... H04N 19/50 703/2 |
| 2013/0041856 A1 | 2/2013 | Benitez et al. |
| 2019/0121348 A1 * | 4/2019 | Cella .................. G05B 23/0297 |

* cited by examiner

LOSSY DATA COMPRESSOR FOR VEHICLE CONTROL SYSTEMS

CROSS REFERENCE

The present application claims the benefit under 35 U.S.C. § 119 of European Patent Application No. EP 18175062.1 filed on May 30, 2018, which is expressly incorporated herein by reference in its entirety.

FIELD

The present invention relates to a lossy data compressor that is particularly suitable for physical measurement data that is to be evaluated for the presence of objects or situations by an at least partially automated vehicle.

BACKGROUND INFORMATION

When driving a vehicle, a human driver captures a plethora of information using his eyes and classifies the visible objects. For example, the driver recognizes lane boundaries, traffic signs, other vehicles and pedestrians and initiates appropriate actions on the manual controls of the vehicle.

For a vehicle to move in traffic in an at least partially automated manner, a functionality is needed to classify objects and situations from physical measurement data that has been captured by sensors from the environment of the vehicle.

European Patent No. EP 1 752 362 B1 describes a lane keeping assistance system for vehicles that classifies lane boundaries according to tapes and rates the possibility that the boundary will be crossed, as well as the potential dangers associated with such crossing.

U.S. Pat. No. 8,682,821 B2 describes a method to evaluate radar data from the environment of the vehicle in order to classify whether certain types of objects or non-human animals are moving in the environment. For this classification, machine learning is used.

SUMMARY

The present invention provides a lossy data compressor for physical measurement data. The lossy data compressor comprises a parametrized mapping network that, when applied to a data point x of the physical measurement data that lives in a space X, produces a point z in a Riemannian manifold Z that has a lower dimensionality than the space X, and configured to provide a point z on Z as output in response to receiving a data point x as input.

For example, if the physical training data consists of images from a camera that have a given width and height in pixels and a color depth of a given number of bits per pixel, then these images live in the space X of all possible images having this width, height and color depth. A data point in x thus corresponds to one such image. On the face of it, it may not be apparent how a mapping of such a data point x to a point z on Z shall constitute a data compression. But this compression is brought about by a reduction of the dimensionality when mapping from space X onto manifold Z.

The manifold Z is a continuous hypersurface that only admits fully continuous paths between any two points on the hypersurface. For example, the surface of a conventional sphere in three-dimensional space is two-dimensional, with a polar angle and an azimuthal angle as degrees of freedom.

The parameters θ of the mapping network are trainable or trained towards an objective that comprises minimizing, on the manifold Z, a distance between a given prior distribution $P_Z$ and a distribution $P_Q$ induced on manifold Z by mapping a given set $P_D$ of physical measurement data from space X onto manifold Z using the mapping network, according to a given distance measure. The distance measure is well-defined both for distances between distributions and for distance between individual points.

The classification problems that are relevant for at least partially automatic vehicles are supervised learning problems, i.e., the learning process has to be anchored to "ground truth": it has to be made known to a classification system, e.g., which traffic signs are to be recognized and what they mean, or which different types of lane markings have which consequences. To this end, training data (such as images) is manually labelled with, e.g., the objects that are actually visible in the image. A machine-learning classification system is then trained so that over a whole set of training images, the truly present objects are correctly recognized. However, labelled training data is a scarce and expensive resource.

In accordance with the present invention, by compressing the physical measurement data with the provided lossy data compressor, they can be brought into a form that is more tractable for subsequent supervised training. Specifically, the dimensionality of the data is reduced by a large amount, so that the supervised training may be performed with less manually labelled training data than a training that is directly performed on the physical measurement data.

At the same time, the combination of the continuous hypersurface with the training objective for the parameters θ of the mapping network ensures that despite the compression to a much lower dimensionality, a semantic similarity that exists between data points x in the high-dimensional space X is preserved when mapping to the lower-dimensional manifold Z. For example, if several images in X show a similar object, then they are mapped to similar locations on the manifold Z. Lossy compression inevitably entails discarding some information, but for the ultimate purpose of controlling the vehicle in traffic, the semantic meaning of objects and situations is important. It is therefore advantageous to preserve semantic similarity, so that the lossy data compression is not a mere culling of information to reduce its volume and make the subsequent classification more tractable solely by virtue of the reduced volume. Rather, the data compression already enhances the data by highlighting regularities in them, so it is actually a pre-processing that does part of the work that otherwise would be performed by the classification alone.

This is advantageous because the training of the mapping network itself may be performed in an unsupervised manner, i.e., it may be performed on unlabeled training data. Thus, a large body of unlabeled data may be used to train the lossy data compressor. Because the compressed data is of a much lower dimensionality on the one hand and also pre-processed with respect to regularities and similarities on the other hand, a classifier for recognizing objects and situations will require fewer labeled data for training.

The combination of Z being a continuous hypersurface and the distance measure being well-defined both for distances between distributions and for distances between individual points facilitates the training of the mapping network. Specifically, gradient descent methods or other methods that require the objective function to be differentiable may be used.

Furthermore, the robustness of the training is improved because the compression may suppress irrelevant alterations of the data, such as noise.

It should be noted that although the parameters θ of the mapping network per se are, on the face of it, just a set of numbers that show no signs of how they have been obtained, statistical methods are available with which it can be verified whether a given mapping network has been trained towards the mentioned objective. In other words, training towards this objective leaves a unique "fingerprint" in the parameters θ of the mapping network. Therefore, the feature "trainable or trained towards the objective" can be regarded as a feature of the finished lossy data compressor, rather than a mere feature of a method for obtaining this compressor.

In a particularly advantageous embodiment, the manifold Z is a hypersphere or a hyperellipsoid. These hypersurfaces are relatively simple, so it is easy to preserve semantic similarity by mapping onto them. At the same time, the equations that define those hypersurfaces also fix the paths between points on these hypersurfaces that are permitted in the first place. I.e., these equations forbid the paths from leaving or puncturing the hypersurface.

In a particularly advantageous embodiment, the distance measure in the objective of the training of the mapping network comprises the Wasserstein distance. In this manner, the mapping network solves the "optimal transport problem" of converting, on the manifold Z, the induced distribution $P_Q$ into the given prior distribution $P_Z$ (or vice versa) at minimum cost.

In this respect, it has to be noted that even though the distribution $P_Q$ is supported by only those values that have been generated from the physical measurement data $P_D$, it is not limited to these values. Rather, the distribution $P_Q$ comprises an infinite number of points in Z that preserves the main features evident from the set $P_D$ of physical measurement data.

Likewise, the original set $P_D$ of physical measurement data can also be construed to represent a distribution that extends far beyond this actual set $P_D$. The preservation of semantic similarity and of relative distances between points x in space X after mapping into Z is valid for the whole distribution, not just for the supporting set $P_D$.

In a further particularly advantageous embodiment, the mapping network comprises at least one neural network. Such networks are very good tools to drastically reduce the dimensionality of a data set.

A neural network as part of the mapping network can also serve another purpose: It can be extended with fixed layers that can be used as a hardware acceleration for the training of the mapping network. As it will be seen later in the discussion of a method for manufacturing the lossy data compressor, one embodiment of this method uses the Sinkhorn algorithm that relies on an iterative calculation involving calculation of an exponential function, matrix multiplication, element-wise division of matrices, and computation of a Frobenius product. Each of these operations can be implemented as a layer of the neural network, so that the massive parallelism of the neural network can be exploited to increase the speed of the computation. A loop that iterates over a sequence of computations for a fixed number of times thus may be implemented in the neural network as repetitions of a sandwich structure in which the individual computations are stacked.

Therefore, in a particularly advantageous embodiment, the neural network comprises at least two instances of one and the same sandwich structure, wherein this sandwich structure comprises a plurality of different layers and wherein each of these layers is configured to perform at least one of calculation of an exponential function, matrix multiplication, element-wise division of matrices, or computation of a Frobenius product.

While the training of the lossy data compressor may be performed on unlabeled data, this does not mean that available a priori information about the physical measurement data and the features to be extracted from these data cannot be exploited by the mapping network. Rather, such a priori information can go into the given prior $P_Z$. For example, if a fixed set of objects is to be recognized in the end, then the prior $P_Z$ may be chosen to contain a number of distinct clusters corresponding to the number of distinct objects in the fixed set. In this manner, the lossy compression will pre-discretize the physical measurement data to some degree for the subsequent classification. Also, physical limits of the measurement range may be reflected in the choice of the prior $P_Z$.

Therefore, in a further particularly advantageous embodiment, the given prior $P_Z$ comprises at least two distinct clusters on the manifold Z.

As mentioned before, the primary raison d'être for the lossy data compressor is facilitating the detection of objects and situations in the environment of a vehicle. Therefore, as a logical extension, the present invention also provides a system for classifying objects or situations in the environment of a vehicle.

This system comprises at least one lossy data compressor described above. This lossy data compressor is communicatively coupled to at least one sensor that is configured to obtain physical measurement data from at least part of the environment of the vehicle.

The system further comprises a classifier module that is communicatively coupled to the lossy data compressor and configured to classify whether the output of the lossy data compressor indicates the presence of at least one object or at least one situation in the environment of the vehicle.

As discussed above, the lossy data compressor and the classifier module work hand in hand in that the compression provides a pre-processing and enhancing of the raw data, so that the classification is facilitated beyond the mere effect of the manifold Z having a lower dimensionality than the space X. The lossy data compressor is obtainable using a large body of unlabeled training data, with little or no labeled data. Training of the classifier module can be accomplished with a far smaller set of labeled training data than would be required if the classification were to be directly performed on the physical measurement data.

In a particularly advantageous embodiment, the classifier module is communicatively coupled to the lossy data compressor via a shared-medium bus network to which further systems of the vehicle are coupled, whereas the lossy data compressor is communicatively coupled to a sensor via a dedicated broadband connection. In this manner, the collection of physical measurement data from different areas within the vehicle is facilitated without hogging an overly high amount of available transmission bandwidth.

Specifically, most of today's vehicles are equipped with a CAN bus or other bus system to which very many vehicle systems are connected. This bus permits all members to communicate with one another and greatly saves cabling compared with the previously used trees of dedicated cables between any two communicating vehicle systems. However, this saving comes at the price of the bus being a shared medium, i.e., only one member may transmit on the bus at any given time, so all members share the available bandwidth. If the whole environment of the vehicle is to be surveyed, e.g., by a set of cameras mounted in various places on the vehicle, a very large amount of raw data is generated. It may not be practical to squeeze these data through, e.g., a "high-speed" CAN bus with 1 Mbit/s total bandwidth. But if the data is lossily compressed close to the sensor, the compressed version is small enough to be transported via the CAN bus. For example, the lossy data compressor may be part of a sensor module for collecting physical measurement data.

In this manner, the upgrading of an existing vehicle with new functionality regarding at least partially automatic movement is facilitated. For example, connecting the plurality of cameras to a central control unit for the automatic movement using dedicated cables may be difficult because there is no physical space left to run those cables.

In a further advantageous embodiment, the system further comprises a decision module that is communicatively coupled with the classifier module and configured to determine, based on the output of the classifier module, whether it is necessary to change the trajectory of the vehicle, or to at least partially deactivate automated driving functionality, to avoid adverse consequences for the vehicle, the driver of the vehicle, or another entity.

The system further comprises an actuation module that is communicatively coupled with the decision module and configured to, in response to said determination being positive, actuate a power train, a braking system, and/or a steering system, of the vehicle, and/or actuate a warning device of the vehicle to emit a warning that is physically perceptible by the driver of the vehicle, and/or cause at least partial deactivation of automated driving functionality of the vehicle.

In this manner, if a given set of labeled training data is available, the overall operating safety of the vehicle may be increased, or, if a given level of overall operating safety is to be provided, this may be achieved with fewer labeled training data.

Besides classification of traffic signs, one further important use case is the classification of small objects on the road-surface as harmless or dangerous for a car. For instance, a brick would be dangerous to run over, whereas a pieces of paper is harmless. This can lead to the triggering of an emergency braking system in case a dangerous object is detected.

Although the use in vehicle systems is the primary use case of the lossy data compressor, the lossy data compressor, and particularly its combination with a further classifier, has a multitude of other applications. Some examples are:

image compression that is tuned to retain certain types of features, for example for a fingerprint database of a law enforcement agency;

image-based detection of diabetic retinopathy or other eye diseases (classification of images into healthy and unhealthy) in an automated diagnosis system. In this use case, the obtaining of labeled "ground truth" must be performed by an ophthalmologist and is thus particularly expensive;

image-based classification of defect or inferior parts in automatic quality control which can trigger inferior parts to be automatically discarded from a production line;

compression of speech samples for classification of who is speaking; and automatic detection of malfunctioning devices/machines/appliances/production-lines by classifying sensory signals recorded during operation into: normal, maintenance required, defect, and triggering repair and maintenance or reduced operation to avoid additional stress.

The present invention also provides a method for manufacturing the lossy data compressor.

This method comprises, in a first step, setting up an objective function for the minimizing of the distance between the prior distribution $P_Z$ and the distribution $P_Q$ induced on manifold Z by the mapping of the physical measurement data set $P_D$. The objective function is a weighted sum of said distance and the entropy of a doubly stochastic matrix P specifying the probability that a randomly generated label belongs to a data point x in $P_D$.

In the second step, the objective function is minimized with respect to the doubly stochastic matrix P to find an optimal matrix P.

In the third step, the objective function is minimized with respect to the parameters $\theta$ of the mapping network to find optimal parameters $\theta$ of the mapping network.

Finally, unless a predetermined termination criterion is satisfied, the method branches back to the second step.

The effect of the entropy in the weighted sum is that the problem is relaxed somehow to make its solution more tractable. For example, if the Wasserstein distance is used as a distance measure, then finding the optimal parameters $\theta$ of the mapping network that minimize the objective function becomes difficult and computationally expensive. Specifically, said relaxation regularizes the problem.

The alternating between optimizing P and optimizing the parameters $\theta$ of the mapping network has the further effect that the finally obtained solution becomes more balanced. If there is only one optimization for only one objective, there is a tendency that properties which are not part of the objective function take a turn for the worse. The alternating reduces this tendency.

In a particularly advantageous embodiment, the objective function comprises a Frobenius dot product of the doubly stochastic matrix P and a cost matrix C that assigns a cost value to every combination of a data point $x_i$ in $P_D$ and a corresponding feature $z_j$ on manifold Z. This Frobenius dot product is particularly suited to be solved using the nearly linear-time Sinkhorn algorithm. Therefore, advantageously, minimizing with respect to P is performed by means of the Sinkhorn algorithm.

In a particularly advantageous embodiment, the cost value corresponds to a Euclidean or geodesic absolute distance between the point on manifold Z that the data point $x_i$ is mapped to and the feature $z_i$. In this manner, the distance may be organically adapted to the chosen manifold Z and to the chosen prior distribution $P_Z$ on Z.

Consider a manifold in d-dimensional space $X \subset \Re^d$. Points in the input space are drawn from a distribution $x \sim p(x)$ with support on X. Given a finite set of samples $\{x_i\}$, i=1, . . . , m, over X, our goal is to learn a latent variable z over a lower dimensional manifold Z of dimension k, with k<<d. The discrete formulation of Optimal Transport provides us with an objective for matching two distributions from empirical samples. Our interest is to learn one such distribution, as a representation of points in the input space. We consider a family of functions $\{f_\theta: X \to Z\}$ in the form of neural networks, parametrized with a tuple of parameters $\theta$. We choose $Z \subset \Re^k$ to be a k-dimensional Riemannian manifold; its form is specified by a prior distribution $P_Z$ of our choice. For every $f_\theta$, we define a transportation problem in the latent space Z having marginal $$\hat{\mu} = \frac{1}{m}\sum_{i=1}^{m} \delta[f_\theta(x_i)] \text{ and } \hat{v} = \frac{1}{m}\sum_{i=1}^{m} \delta[z_i],$$

where δ is the Kronecker-delta, that means $\hat{\mu}$ and $\hat{v}$ are the empirical marginal distributions given by the samples $\{x_i\}$, i=1, ..., m, and the corresponding features $\{z_i\}$, i=1, ..., m.

We define a cost matrix C which in our case depends on the model parameters. For example, it can be defined by the Euclidean distance $$C(\theta)_{i,j} = \|f_\theta(x_i) - z_j\|.$$

The choice of the distance is arbitrary and it should be adapted to the particular latent space we are dealing with—one could for instance also use the geodesic distance on the manifold Z. Matching p(z|x) and $P_Z$ can be achieved by minimizing the Wasserstein distance. Since this is computationally costly, we instead minimize the entropy-relaxed Wasserstein distance, which forms the learning problem:

$$\min_\theta \min_P \langle P, C(\theta)\rangle - \lambda \cdot H(P) =: \min_\theta \min_P W_\lambda(P, C(\theta)).$$

where < > is the Frobenius dot product, H is the entropy, λ is a free parameter that determines approximation quality (for λ=0, $W_\lambda$ corresponds to the Wasserstein distance) and P is a matrix that specifies the probability that a (randomly generated) label belongs to a data-point (that is, entries in P must be positive and rows and columns must sum up to one, or in other words P must be in the set of doubly stochastic matrices).

Our end-goal is learning an optimal function $f_\theta$. Without entropy regularization (λ=0), finding a minimizer would be difficult and computationally expensive. If instead we work with the regularized version of the transportation problem (λ>1), we can alternate stochastic gradient descent on the model parameters θ and the nearly linear-time Sinkhorn algorithm for solving the matching problem with respect to P.

Since the Sinkhorn algorithm is iterative and tends to converge quickly, we can unroll L iterations of the algorithm and add them as layers to the neural network, which means that the inner min operation is performed by these layers (L Sinkhorn iterations) and the outer min operation over θ is performed via stochastic gradient descent.

Thus, in a further particularly advantageous embodiment, the minimizing with respect to the parameters θ of the mapping network is performed by stochastic gradient descent on the parameters θ of the mapping network.

The lossy data compressor and the system may be at least partially computer-implemented. In particular, it may be possible to upgrade a previous data compressor or a previous vehicle system by software to provide it with the functionality according to the invention. Such software is therefore a marketable product of its own. The invention therefore also relates to a computer program with machine readable instructions, which, when executed by a computer, and/or by a control unit, upgrade the computer, and/or the control unit, to the lossy data compressor, and/or to the system, provided by the invention. The present invention also relates to a non-transitory machine-readable storage medium or a download product with the computer program.

Further improvements of the present invention are detailed in the following in combination with a description of preferred embodiments using Figures.

DETAILED DESCRIPTION OF EXAMPLE EMBODIMENTS

Figure 1:
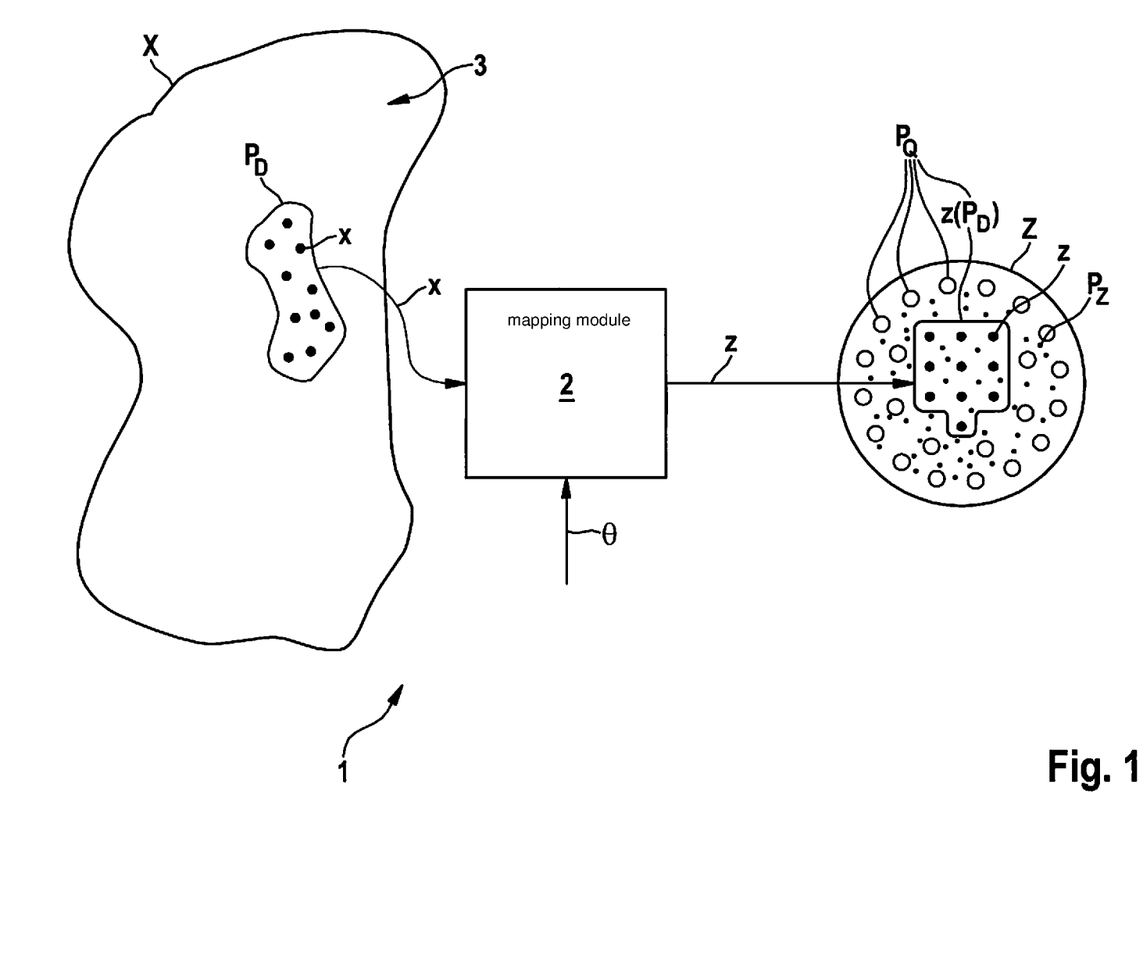
FIG. 1 shows an exemplary embodiment of the lossy data compressor 1.

FIG. 1 illustrates an exemplary embodiment of the lossy data compressor 1. A mapping module 2, parametrized by a tuple of parameters θ, maps data points x from a training set $P_D$, which is a subset of the space X, to points z on lower-dimensional manifold Z. All physical measurement data 3 live in the space X. The manifold Z is defined by a given prior $P_Z$. In the example illustrated in FIG. 1, the manifold Z is a sphere, and the prior $P_Z$ is a random distribution of points scattered across the surface of this sphere.

All points z that are the result of mapping a data point x from the set $P_D$ make up the set $z(P_D)$. However, the distribution $P_Q$ induced by the mapping includes many more points (drawn as hollow circles) over and above the concrete set $z(P_D)$.

Figure 2:
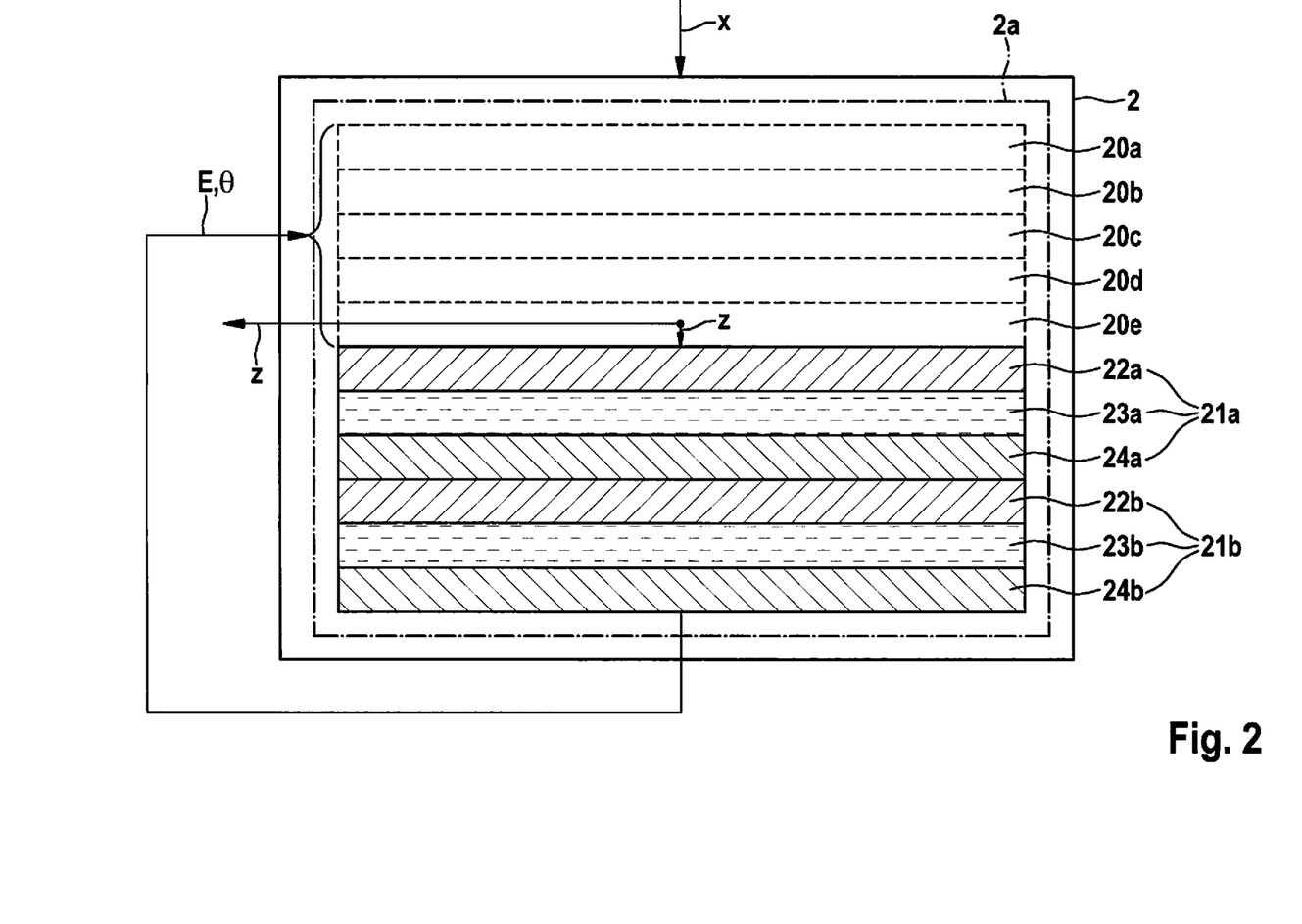
FIG. 2 shows an exemplary neural network 2a within mapping network 2 of lossy data compressor 1.

FIG. 2 shows an exemplary neural network 2a in a mapping network 2. The actual mapping of a data point x to a data point z is performed by layers 20a-20e drawn in dashed contours. These layers 20a-20e are parametrized by the tuple of parameters θ.

In addition, the neural network 2a comprises two instances 21a and 21b of layer sandwiches. The layers in these sandwiches are fixed (i.e., they do not depend on the parameters θ) and are therefore drawn in solid contours. The first sandwich 21a comprises layers 22a, 23a and 24a. The second sandwich 21b comprises layers 22b, 23b and 24b. As denoted by the identical shadings, layer 22b performs the same functionality as layer 22a, layer 23b performs the same functionality as layer 23a, and layer 24b performs the same functionality as layer 24a. The combination of the layer sandwiches 21a and 21b is used to compute the error signal E that is a measure for the entropy-relaxed Wasserstein distance between the distribution $P_Q$ induced on Z and the prior distribution $P_Z$.

During training of the neural network 2a, the parameters θ are adjusted to minimize the error signal E.

Figure 3:
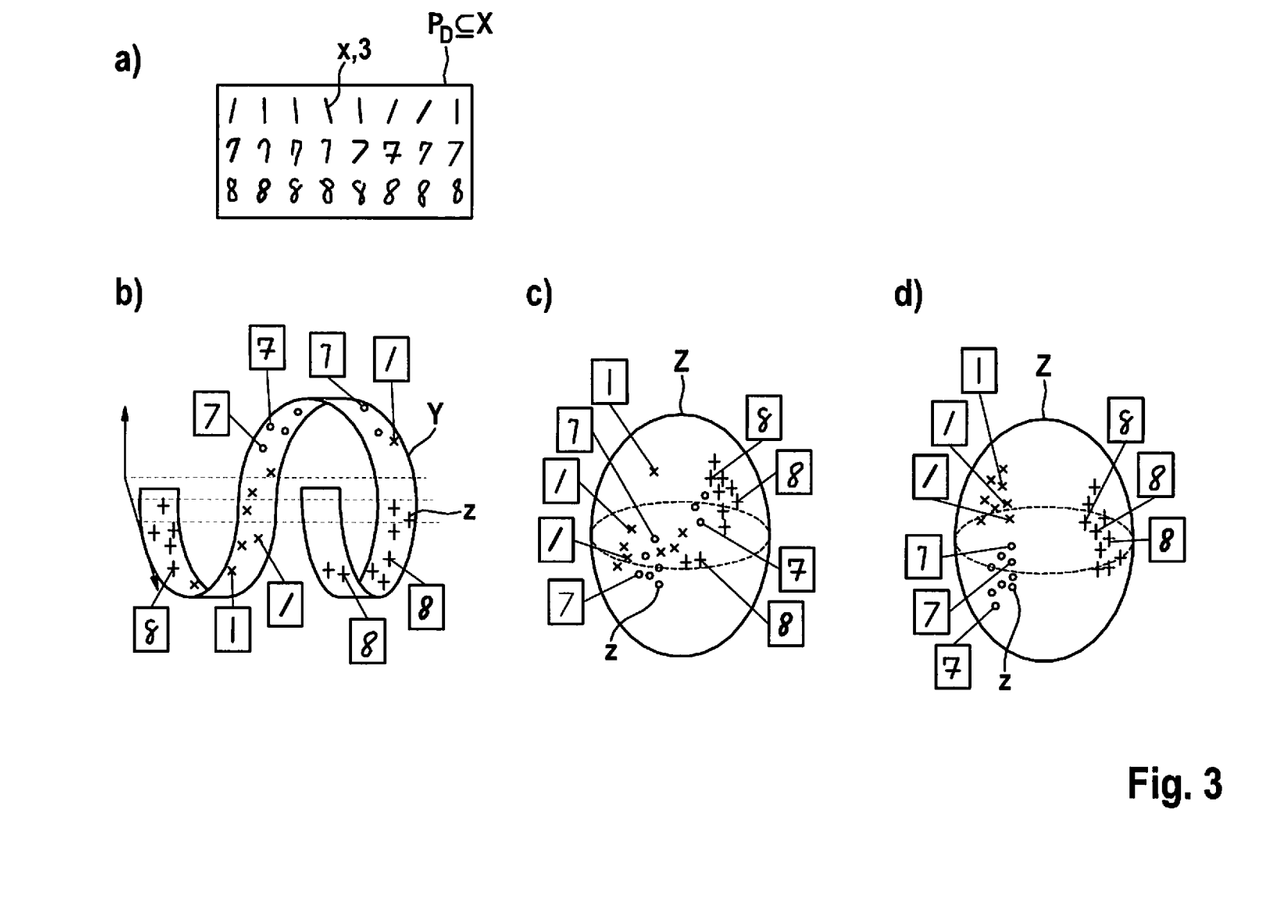
FIG. 3 shows an illustration of the advantage of preserving semantic similarity.

FIG. 3a shows an exemplary set $P_D$ of physical measurement data 3 in the form of handwritten numbers x. FIGS. 3b to 3d show different mappings of the data points x to lower-dimensional manifold.

FIG. 3b shows a first mapping onto a band-shaped lower-dimensional manifold Y. The manifold has been assigned reference sign Y instead of Z because it does not fulfill the condition that it only admits fully continuous paths between any two points on this manifold Y. Rather, a path from one point to another point may lead to areas that are off the band.

The mapping to this manifold Y is not well-behaved because points relating to different numbers appear in a wild mixture.

FIG. 3c shows a second mapping onto a spherical lower-dimensional manifold Z. Here, there are no discontinuous paths between points on the manifold Z that leave the manifold. Consequently, the surface is smooth. However, the points z relating to different numbers are still mixed.

In FIG. 3d, the same manifold Z is used. In addition, the mapping has been performed with the objective that the induced distribution $P_Q$ shall match the given prior distribution $P_Z$. Consequently, the points z appear clustered on the manifold Z according to the numbers to which they relate. What is more, it appears that distances in the original space X have been preserved after mapping to the manifold Z, and that semantic similarity has been preserved in the form of "closeness" on the manifold Z: The instance of the number "1" that is most similar to a "7" is quite close to the corresponding instance of the number "7" that is most similar to a "1".

Figure 4:
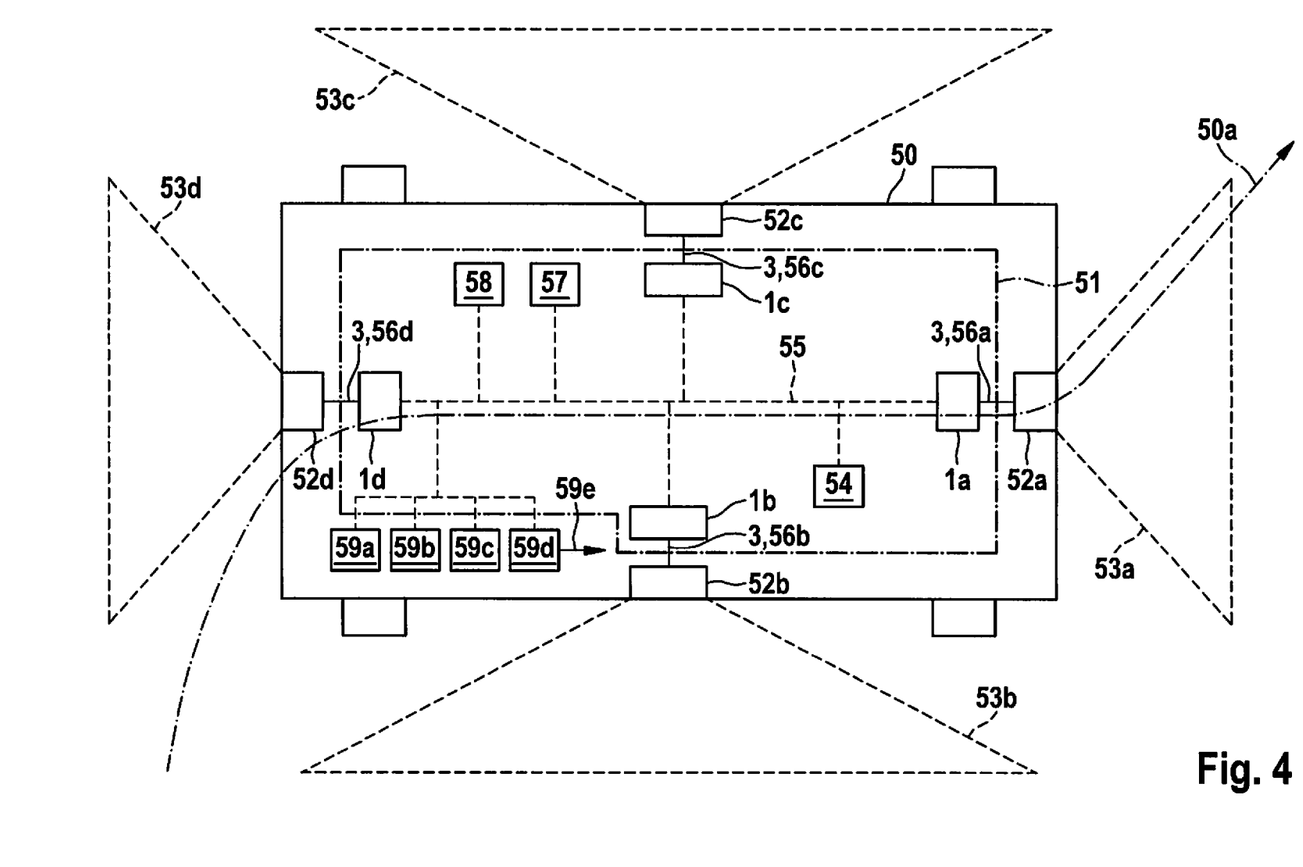
FIG. 4 shows an exemplary classification system 51 in vehicle 50.

FIG. 4 shows an exemplary vehicle 50 that is fitted with a system 51 for classifying objects or situations in its environment. The vehicle 50 is fitted with four camera sensors 52a-52d that monitor different parts 53a-53d of the environment of the vehicle 50. Each sensor 52a-52d is connected to a corresponding lossy data compressor 1a-1d via a respective dedicated broadband connection 56a-56d and receives physical measurement data 3 over this connection 56a-56d.

The vehicle 50 is equipped with a CAN bus as a shared medium bus network 55. The lossy data compressors 1a-1d are connected to this network 55 and use it to forward the compressed data to the classifier module 54. The classifier module 54 forwards the result of the classification to the decision module 57 via the network 55. If the decision module 57 finds that there is a need to change the trajectory 50a of the vehicle 50, or to at least partially disable automated driving functionality, the actuation module 58 is notified. The actuation module 58 then actuates the power train 59a, the braking system 59b, and/or the steering system 59c, to this effect. The actuation module 58 may also actuate a warning device 59d of the vehicle 50 to emit a warning 59e that is physically perceptible by the driver of the vehicle 50.

The figure of the classifier module 54, the decision module 57 and the actuation module 58 in distinct places within the vehicle 50 is not limiting in the sense that such placing is required. Rather, these modules may also be combined, e.g., into one single control unit. The exemplary placing in FIG. 4 is illustrative to show that the presence of the shared-medium bus network 55 in the vehicle 50 provides a high degree of freedom as to the placement of components.

Figure 5:
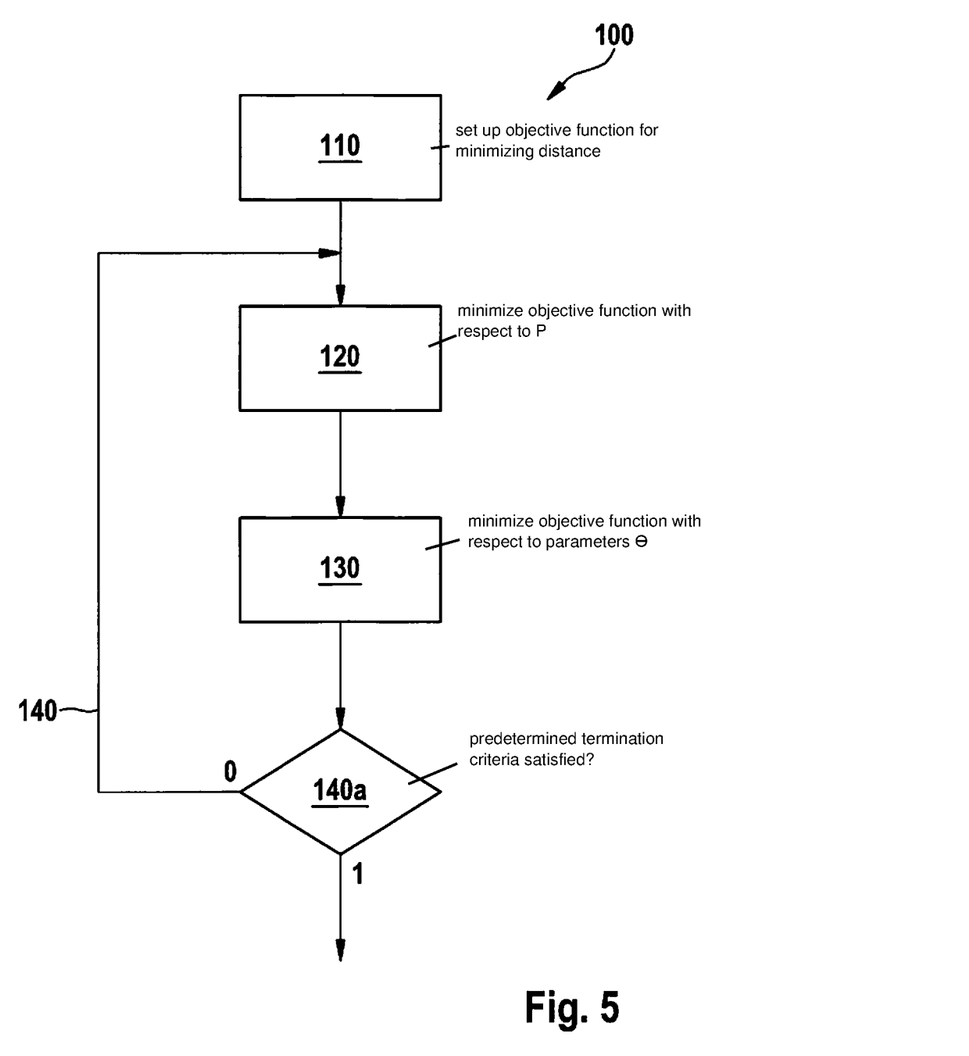
FIG. 5 shows an exemplary embodiment of the method 100.

FIG. 5 shows an exemplary embodiment of the method 100 for manufacturing the lossy data compressor 1. The main aspect of this manufacturing is the training of the mapping network 2 within the lossy data compressor 1.

In a first step 110, an objective function is set up for the minimizing of the distance between the prior distribution $P_Z$ and the distribution $P_Q$ induced on manifold Z by the mapping of the physical measurement data set $P_D$. This objective function is minimized in the following in an alternating manner.

In step 120, the objective function is minimized with respect to the doubly stochastic matrix P to find an optimal matrix P.

In step 130, the objective function is minimized with respect to the parameters θ of the mapping network to find optimal parameters θ of the mapping network.

It is then checked in diamond 140a whether a predetermined termination criterion is satisfied. Such a termination criterion may, for example, be formulated in terms of a threshold for the absolute value of the objective function, or for the relative change of the value of the objective function from one iteration to the next. If the termination criterion is met (logical value 1), the method 100 terminates. If the termination criterion is not met (logical value 0), then, in step 140, the method 100 branches back to the minimizing with respect to P according to step 120.

What is claimed is:

1. A sensor arrangement configured to provide compressed physical measurement data characterizing an environment sensed by the sensor arrangement, the sensor arrangement comprising:
   a sensor, wherein the sensor is configured to sense the environment; and
   a lossy data compressor comprising a processor arranged for obtaining from the sensor raw physical measurement data produced by the sensor and characterizing the sensed environment, wherein the sensor arrangement is configured to generate the compressed physical measurement data by the a processor executing as a parametrized neural network that, when applied to a data point x of the physical measurement data that lives in a space X, produces a point z in a predefined Riemannian manifold Z that has a lower dimensionality than the space X and that provides the point z on the manifold Z as output in response to receiving the data point x as input;
   wherein:
      the manifold Z is a continuous hypersurface that only admits fully continuous paths between any two points on the hypersurface;
      parameters θ of the neural network are trainable or trained towards an objective that comprises minimizing, on the manifold Z, a distance measure, with respect to both a distance between distributions and a distance between individual points, between a given prior distribution $P_Z$ and a distribution $P_Q$ induced on manifold Z by mapping a given set $P_D$ of physical measurement data from space X onto manifold Z using the neural network; and
      the processor is configured to output the generated compressed physical measurement data.

2. A system for classifying objects or situations in an environment of a vehicle, comprising:
   at least one sensor that is configured to obtain physical measurement data defined within a space X from at least part of the environment of the vehicle;
   at least one lossy data compressor that is:
      communicatively coupled to the at least one sensor to receive the physical measurement data from the at least one sensor; and
      configured to produce output based on the physical measurement data received from the at least one sensor; and
   a classifier module communicatively coupled to the lossy data compressor and configured to classify the output of the lossy data compressor as including an indication of presence of at least one predefined object or at least one predefined situation in the environment of the vehicle; and
   a decision module;
   wherein:
      the decision module is configured to determine, based on the classification, a modified trajectory of the vehicle or a modified status of an automated driving functionality of the vehicle;

the lossy data compressor includes a parametrized neural network that, when applied to a data point x of the physical measurement data, produces a point z in a predefined input Riemannian manifold Z that has a lower dimensionality than the space X and that provides the point z on the manifold Z as part of the output in response to receiving the data point x as input;

the manifold Z is a continuous hypersurface that only admits fully continuous paths between any two points on the hypersurface; and parameters θ of the neural network are trainable or trained towards an objective that comprises minimizing, on the manifold Z, a distance measure, with respect to both a distance between distributions and a distance between individual points, between a given prior distribution $P_Z$ and a distribution $P_Q$ induced on manifold Z by mapping a given set $P_D$ of physical measurement data from space X onto manifold Z using the neural network.

3. The system of claim 2, wherein the manifold Z is a hypersphere or a hyperellipsoid.

4. The system of claim 2, wherein the distance measure comprises a Wasserstein distance.

5. The system of claim 2, wherein the neural network comprises at least two instances of a single same sandwich structure that includes a plurality of different layers and wherein each of the layers is configured to perform at least one of calculation of an exponential function, matrix multiplication, element-wise division of matrices, and computation of a Frobenius product.

6. The system of claim 2, wherein the given prior distribution $P_Z$ comprises at least two distinct clusters on the manifold Z.

7. The system of claim 2, wherein the classifier module is communicatively coupled to the lossy data compressor via a shared-medium bus network to which further systems of the vehicle are coupled, and each of the at least one lossy data compressor is communicatively coupled to a respective one or more of the at least one sensor via a dedicated broadband connection.

8. The system of claim 2, wherein:

the decision module is configured to determine, based on the classification, whether it is necessary to change from a prior trajectory of the vehicle, or to at least partially deactivate the automated driving functionality, to avoid adverse consequences for the vehicle, the driver of the vehicle, or another entity predicted to be caused by the predefined object or situation in the environment of the vehicle; and the system further comprises an actuation module communicatively coupled with the decision module and configured to, in response to said determination of the necessity being positive, actuate a power train of the vehicle, and/or actuate a braking system of the vehicle, and/or actuate a steering system of the vehicle, and/or actuate a warning device of the vehicle to emit a warning that is physically perceptible by a driver of the vehicle, and/or cause at least partial deactivation of the automated driving functionality of the vehicle.

9. A method for operating a vehicle comprising:

providing a lossy data compressor in the vehicle;

the lossy data compressor of the vehicle producing output based on physical measurement data defined within a space X and received from at least one sensor that produces the physical measurement data by sensing an environment of the vehicle;

a classifier module of the vehicle classifying the output produced by the lossy data compressor as including an indication of presence of at least one predefined object or at least one predefined situation in the environment of the vehicle; and a decision module of the vehicle providing, based on the classification, a modified trajectory of the vehicle or a modified status of an automated driving functionality of the vehicle;

wherein:

the lossy data compressor including a parametrized neural network that, when applied to each of a plurality of data points x of the physical measurement data, produces respective corresponding points z in a predefined input Riemannian manifold Z that has a lower dimensionality than the space X and that provides the points z on the manifold Z as part of the output in response to receiving the data points x as input;

the manifold Z is a continuous hypersurface that only admits fully continuous paths between any two points on the hypersurface;

parameters θ of the neural network are trainable or trained towards an objective that comprises minimizing, on the manifold Z, a distance measure, with respect to both a distance between distributions and a distance between individual points, between a given prior distribution $P_Z$ and a distribution $P_Q$ induced on manifold Z by mapping a given set $P_D$ of physical measurement data from space X onto manifold Z using the neural network; and the providing of the lossy data compressor includes:

setting up an objective function for the minimizing of the distance measure, the objective function being a weighted sum of a distance and an entropy of a doubly stochastic matrix P specifying a probability that a randomly generated label belongs to one of the data points x in $P_D$; and iteratively performing the following until a predetermined termination criterion is satisfied:

minimizing the objective function with respect to the doubly stochastic matrix P to find an optimal matrix P; and minimizing the objective function with respect to the parameters θ of the neural network to find optimal parameters θ of the neural network.

10. The method of claim 9, wherein the objective function comprises a Frobenius dot product of the doubly stochastic matrix P and a cost matrix C that assigns a cost value to every combination of a data point $x_i$ in $P_D$ and a corresponding feature $z_j$ on the manifold Z.

11. The method of claim 10, wherein the cost value corresponds to a Euclidean or geodesic absolute distance between the point on the manifold Z to which the data point $x_i$ is mapped and the corresponding feature $z_i$.

12. The method of claim 10, wherein the minimizing with respect to the matrix P is performed using a Sinkhorn algorithm.

13. The method of claim 9, wherein the minimizing with respect to the parameters θ of the neural network is performed by stochastic gradient descent on the parameters θ of the neural network.

14. At least one non-transitory machine readable storage medium on which are stored instructions that are executable by at least one processor and that, when executed by the at least one processor, cause the at least one processor to perform a method for a vehicle, the method comprising:

receiving from at least one sensor physical measurement data that is defined within a space X and that produced by the one sensor by sensing at least part of an environment of the vehicle;

producing output based on the physical measurement data received from the at least one sensor;

classifying the output as including an indication of presence of at least one predefined object or at least one predefined situation in the environment of the vehicle; and providing, based on the classification, a modified trajectory of the vehicle or a modified status of an automated driving functionality of the vehicle;

wherein:

the production of the output includes executing a parametrized neural network that, when applied to a data point x of the physical measurement data, produces a point z in a predefined Riemannian manifold Z that has a lower dimensionality than the space X and that provides the point z on the manifold Z as part of the output in response to receiving a data point x as input;

wherein:

the manifold Z is a continuous hypersurface that only admits fully continuous paths between any two points on the hypersurface; and parameters $\theta$ of the mapping network are trainable or trained towards an objective that comprises minimizing, on the manifold Z, a distance measure, with respect to both a distance between distributions and distance between individual points, between a given prior distribution $P_Z$ and a distribution $P_Q$ induced on manifold Z by mapping a given set $P_D$ of physical measurement data from space X onto manifold Z using the neural network.

15. A method of manufacturing a sensor arrangement configured to provide compressed physical measurement data characterizing an environment sensed by the sensor arrangement, the method comprising:

providing a processor that executes as a parametrized lossy data compressing neural network that, when applied to each of a plurality of data points x of raw physical measurement data that lives in a space X, produces, as the compressed physical measurement data, respective corresponding points z in a predefined input Riemannian manifold Z that has a lower dimensionality than the space X and that provides the points z on the manifold Z as part of output in response to receiving the data points x as input;

provide a sensor that includes hardware to sense the environment and thereby generate the raw physical measurement data characterizing the sensed environment; and communicatively couple the processor to the sensor for the processor to obtain the raw physical measurement data from the sensor in order to produce the compressed physical measurement data using the raw physical measurement data;

wherein:

the manifold Z is a continuous hypersurface that only admits fully continuous paths between any two points on the hypersurface;

parameters $\theta$ of the neural network are trainable or trained so that the processor, executing as the lossy data compressing neural network, minimizes, on the manifold Z, a distance measure, with respect to both a distance between distributions and a distance between individual points, between a given prior distribution $P_Z$ and a distribution $P_Q$ induced on manifold Z by mapping a given set $P_D$ of physical measurement data from space X onto manifold Z; and the providing of the processor that executes as the lossy data compressing neural network includes:

setting up an objective function for the minimizing of the distance measure, the objective function being a weighted sum of a distance and an entropy of a doubly stochastic matrix P specifying a probability that a randomly generated label belongs to one of the data points x in $P_D$; and the processor iteratively performing the following until a predetermined termination criterion is satisfied:

minimizing the objective function with respect to the doubly stochastic matrix P to find an optimal matrix P; and minimizing the objective function with respect to the parameters $\theta$ of the neural network to find optimal parameters $\theta$ of the neural network.

* * * * *

UNITED STATES PATENT AND TRADEMARK OFFICE
CERTIFICATE OF CORRECTION

Page 1 of 1

PATENT NO. : 11,150,657 B2
APPLICATION NO. : 16/420440
DATED : October 19, 2021
INVENTOR(S) : Marcello Carioni et al.

It is certified that error appears in the above-identified patent and that said Letters Patent is hereby corrected as shown below:

On the Title Page

In Item (30) Foreign Application Priority Data, replace:
"18175062"
With:
--18175062.1--

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*